United States Patent [19]
Allgood

[11] 4,303,958
[45] Dec. 1, 1981

[54] REVERSE BATTERY PROTECTION

[75] Inventor: Robert N. Allgood, Austin, Tex.

[73] Assignee: Motorola Inc., Schaumburg, Ill.

[21] Appl. No.: 49,370

[22] Filed: Jun. 18, 1979

[51] Int. Cl.$^3$ .................................................. H01L 27/04
[52] U.S. Cl. ................................. 361/100; 307/304; 357/42
[58] Field of Search .................... 361/82, 84, 100; 357/41, 42, 23; 307/304, 213

[56] References Cited

U.S. PATENT DOCUMENTS

| | | | |
|---|---|---|---|
| 3,932,884 | 1/1976 | Kitamura | 357/42 |
| 3,934,399 | 1/1976 | Nishimura et al. | 357/42 |
| 3,936,676 | 2/1976 | Fujita | 357/42 |
| 4,006,491 | 2/1977 | Alaspa et al. | 357/42 |
| 4,039,869 | 8/1977 | Goldman et al. | 357/42 |
| 4,191,898 | 3/1980 | Ulmer | 357/304 |
| 4,209,713 | 6/1980 | Satou et al. | 357/42 |

*Primary Examiner*—William D. Larkins
*Attorney, Agent, or Firm*—Anthony J. Sarli, Jr.; Vincent B. Ingrassia; Jeffrey Van Myers

[57] ABSTRACT

There is provided a reverse battery protection circuit which does not have current limiting resistors to limit current in all portions of the circuit. The protection is obtained by connecting the substrate tubs of N-channel drivers through another N-channel transistor to VSS. The another N-channel transistor has its gate electrode connected to voltage terminal VDD. Accordingly, when reverse voltage is applied to the circuit, VDD will be negative and therefore the another N-channel transistor will not be conductive. This prevents the output driver transistor from becoming a conductive parasitic bipolar transistor.

7 Claims, 3 Drawing Figures

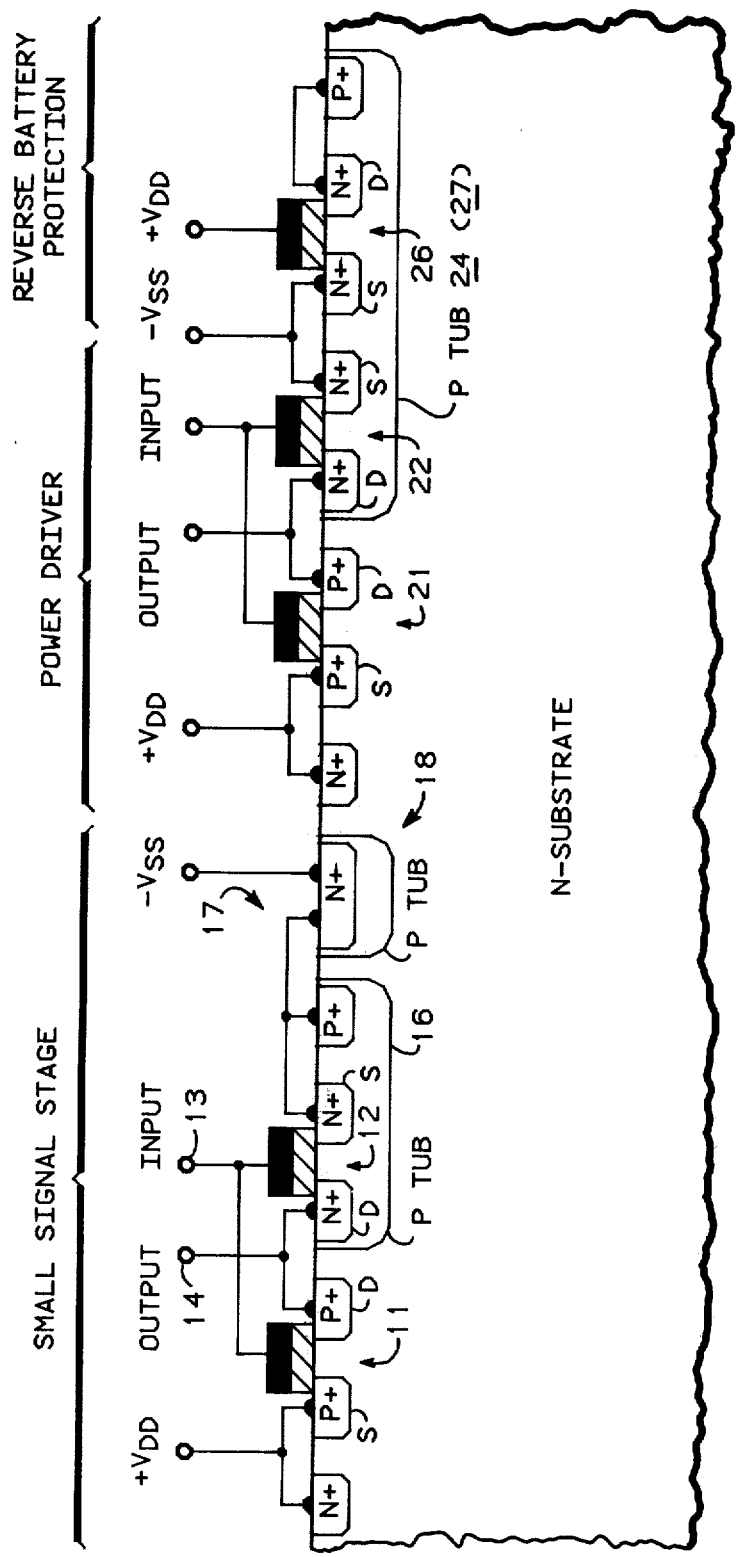

REVERSE BATTERY PROTECTION

This invention relates, in general, to reverse polarity protection circuits, and more particularly, to a reverse battery protection circuit useful in metal oxide semiconductor (MOS) circuits.

Reverse battery protection is desirable in battery operated circuits where temporary connection can be made to the circuit in a reverse polarity manner. This is particularly true in a CMOS integrated circuit since with reverse polarity applied the CMOS integrated circuit will look like a large forward biased diode due to VSS being hardwired to P+ tubs and VDD being connected to the N substrate. Even if the transistors of the CMOS circuit are not damaged with reverse power applied to the circuit, it is possible for the bond wires to be damaged if the current flowing through the bond wires becomes greater than the bond wire fuze limit. Current limiting resistors are not satisfactory in some circuits where a high current drive is required. One such application is in battery operated smoke detectors wherein a buzzer or an alarm is sounded. The alarm is driven by an output driver and generally requires the full amount of current that the battery can supply. Although it is not possible to permanently connect a 9 volt battery in a reverse polarity configuration to a smoke detector, it is possible to momentarily make contact between the battery and the smoke detector leads in a reverse polarity configuration. The momentary contact is sufficient to damage the integrated circuit chip.

Accordingly, it is an object of the present invention to provide an integrated circuit chip which has reverse battery protection without limiting the current requirement for certain portions of the circuit.

Another object of the present invention is to provide a circuit on an integrated circuit chip which will fully protect the integrated circuit chip against power supply reversal without adding resistance to output driver leads in the chip.

SUMMARY OF THE INVENTION

In carrying out the above and other objects of the present invention, there is provided a circuit for use on an integrated circuit chip which does not current limit high output current circuits when proper polarity voltage is applied to the chip, but yet eliminates formation of large conductive forward biased diodes in the high current circuit when reverse polarity voltage is applied to the integrated circuit chip. In the high current circuit, tubs of N-channel drivers are not hardwired to VSS, but rather are tied to VSS through another N-channel transistor whose gate is tied to VDD. As a result, when the supply leads are reversed the tub floats and the inherent parasitic bipolar transistor will not have a source of base current and therefore prevents the inherent parasitic bipolar transistor from becoming a large forward biased diode.

The subject matter which is regarded as the invention is set forth in appended claims. The invention itself, however, together with further objects and advantages thereof, may be better understood by referring to the following detailed description taken in conjunction with the accompanying drawings.

BRIEF DESCRIPTION OF THE DRAWINGS

FIG. 3 is a pictorial representation of a cross-section of an integrated circuit implementation of one form of the present invention.

DETAILED DESCRIPTION OF THE DRAWINGS

Figure 1:
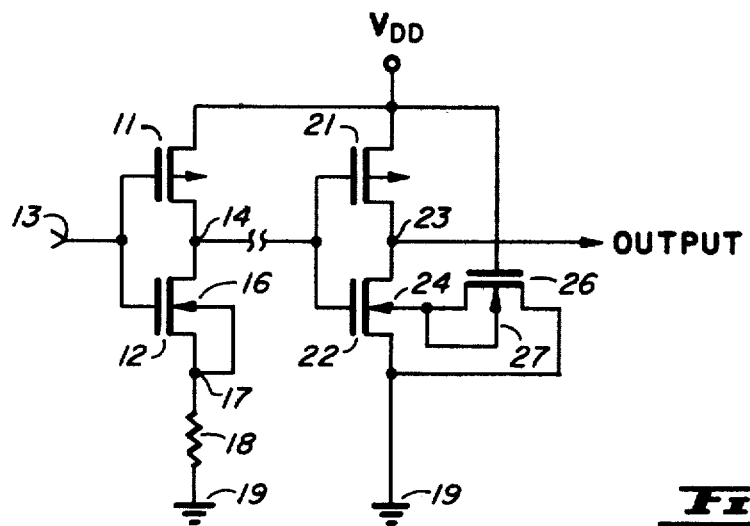
FIG. 1 shows in schematic form an embodiment of the present invention.

A portion of an integrated circuit chip having reverse battery protection is shown in FIG. 1. Transistors 11 and 12 form an inverter which provides an output at node 14. The output at node 14 is connected to gate electrodes of other transistors and therefore does not provide very much output current. Transistor 11 is a P-channel transistor and has its gate electrode connected to an input line 13. The source of P-channel transistor 11 is connected to voltage terminal VDD. Transistor 12 is an N-channel transistor connected in series with transistor 11 forming node 14 therebetween, and having its gate electrode connected to input 13. P tub 16 of transistor 12 is connected to the source of transistor 12. Resistor 18 is in series between transistor 12 and a reference terminal 19 which is commonly known as VSS. If it were not for resistor 18, P tub 16 would be hardwired to VSS. Resistor 18 serves as a current limiting resistor for the inverter formed by transistors 11 and 12 when reverse battery voltage is applied between terminal VDD and ground 19. In smoke detector circuits using a nine volt battery resistor 18 will generally keep the current flow through bond wires of the chip below the fuze limit of the bond wires if resistor 18 provides approximately 45 ohms of resistance. However, in a preferred embodiment resistor 18 provides 100 ohms of resistance to insure a safe operating margin and at the same time provides some leeway in case of process variation effects upon the ohmic value of resistor 18. A secondary reference or ground is established at node 17 and this secondary reference can be used by all low current circuits on the chip.

Output node 14 can be coupled to other circuitry such as gate electrodes of drivers 21 and 22. Transistor 21 is a P-channel transistor having a source connected to voltage terminal VDD and has its drain electrode connected to node 23. N-channel transistor 22 is in series with P-channel transistor 21 and has its drain electrode connected to node 23 and its source electrode connected to ground 19. The gate electrodes of transistors 21 and 22 are shown coupled to output node 14. P tub 24 of transistor 22 is coupled through N-channel transistor 26 to ground 19. In a preferred embodiment, N-channel transistor 26 is in the same P tub as N-channel transistor 22. Accordingly, P tubs 24 and 27 are one and the same in a preferred embodiment. The gate electrode of transistor 26 is connected to voltage terminal VDD which causes transistor 26 to be forward biased thereby completing the path for substrate 24 to ground 19. Node 23 serves as the output for the output driver and provides a full current capability output.

In a typical CMOS circuit not having reverse battery protection, resistor 18 would be replaced by a short and transistor 26 would not be required. If transistor 26 were absent, substrate 24 would be directly connected or hardwired to ground 19. The addition of resistor 18 provides reverse battery protection for all circuits on the integrated circuit chip requiring low current flow. On most integrated circuit chips one resistor 18 would be sufficient for all the returns from the low current circuits which would be connected to node 17. This would provide a ground reference for the low current circuits which would be separated from ground 19 by resistor 18. For an output driver requiring full current, a current limiter would not be desirable and therefore transistor 26 is used to provide the reverse battery protection. By the use of transistor 26, means are provided to internally limit the reverse current while not degrading the output drive capabilities of the circuit. Transistor 26 serves to remove any source of bias current to the base of the inherent parasitic bipolar transistor formed by transistor 22. An additional precaution that may be desirable to take would be to avoid having a ground line tied to a P+ difusion as would be the case if the VSS or ground line is tunneled under a metal line, because this would create a large forward biased diode between the P+ diffusion and the substrate in a reverse battery condition.

It is preferred that resistor 18 be an electrically isolated resistor. In metal gate CMOS this can be accomplished by using an N-defused resistor in a floating P tub. In silicon gate processes resistor 18 can be made from doped polysilicon, or regardless of the process it could also be a thin film resistor.

In most integrated circuit chips, it is only necessary to provide one additional N-channel transistor to connect a P tub to ground. Then all other high current circuits can have their P tubs disconnected from ground and connected to the one additional N-channel transistor.

Figure 2:
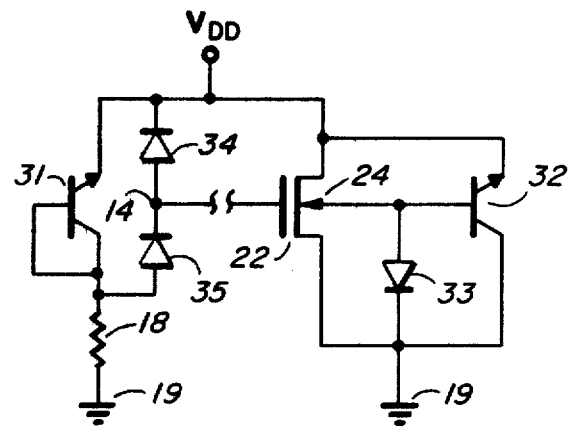
FIG. 2 is a model of the circuitry of FIG. 1 when reverse supply voltage is applied to the circuit.

FIG. 2 illustrates a model of the circuitry of FIG. 1 when reverse polarity voltage is applied to terminals VDD and ground 19. The forward biased diode formed by transistor 21 is not illustrated since it is not needed for an understanding of the present invention. Portions of transistor 12 are used to form parasitic bipolar transistor 31. Transistor 31 has its base connected to its collector which causes the parasitic bipolar transistor to function as a diode. However, the current flow through transistor 31 is limited by resistor 18, and therefore damage to the integrated circuit chip is prevented. Portions of transistors 11 and 12 (of FIG. 1) form series connected diodes 34 and 35. Diode 34 has its cathode connected to voltage terminal $V_{DD}$, which is assumed to have a negative voltage applied to it for purposes of explanation of FIG. 2. The anode of diode 34 is connected to node 14, and the cathode of diode 35 is connected to node 14. The anode of diode 35 is connected to the collector and base of transistor 31. The voltage drop across transistor 31 is equal to one diode drop and as can be seen this voltage drop appears across diodes 34 and 35 also. Accordingly, the voltage at node 14 is approximately equal to one-half of a diode drop, which is not sufficient to forward bias a transistor which may be connected to node 14, such as transistor 22.

Transistor 22 will not form a parasitic bipolar transistor since its P tub 24 is not connected to ground. P tub 24 is connected to N-channel transistor 26 which forms a parasitic bipolar transistor 32. However, as can be seen in FIG. 2 the base electrode of transistor 32 is connected to P tub 24 and therefore does not receive any base current and therefore a conduction path is not provided between voltage terminals VDD and ground through transistors 22 and 32 when reverse polarity voltage is applied to the circuit. Also formed as a portion of transistors 22 and 26 is a diode 33. However, the anode of diode 33 is connected to the base of transistor 32 which as noted hereinbefore has no current source, and so diode 33 also does not conduct any current.

By now it should be appreciated that there has been provided a reverse battery protection circuit particularly useful in CMOS circuits such as smoke detectors. The P tub of an N-channel driver is tied to VSS or ground through another N-channel transistor within the same tub whose gate is connected to VDD. Accordingly, when reverse voltage is applied to the circuit, the VDD terminal becomes negative and this causes the tub transistor to be turned off. It should be noted that a guarded VSS is provided for the low current circuits of the integrated circuit chip.

I claim:

1. A reverse battery protection circuit for use on an integrated MOS circuit, comprising:
    a first MOS transistor of a first consuctivity type and having a source electrode coupled to a first supply terminal, a drain electrode coupled to an output terminal of the MOS circuit, and a gate electrode, the source and drain electrode being formed in a second conductivity type substrate portion in contact with a substrate portion of the first conductivity type;
    means for coupling said substrate portion of the first conductivity type to a second supply terminal of the MOS circuit; and
    a second MOS transistor of the first conductivity type and having a source electrode coupled to the source electrode of the first MOS transistor, a drain electrode coupled to the second conductivity type substrate portion, and a gate electrode coupled to said second supply terminal of the MOS circuit to provide reverse battery protection to the circuit.

2. The reverse battery protection circuit of:
    a third MOS transistor of the first conductivity type having a source electrode, a drain electrode and a gate electrode coupled to an input terminal of the MOS circuit; and
    a current limiting resistor connected in series with the third MOS transistor to limit current flow in the input portions of the MOS circuit.

3. A reverse battery protection circuit for use in a MOS output driver, the output driver being coupled between a first and a second voltage terminal, comprising:
    a first transistor having a source electrode coupled to the first voltage terminal, a drain electrode, and a gate electrode;
    a second transistor having a source electrode coupled to the second voltage terminal, a drain electrode coupled to the drain electrode of the first transistor, and a gate electrode coupled to the gate electrode of the first transistor, the source and drain electrodes being formed in a tub of a first conductivity type in a substrate of a second conductivity type; and
    a third transistor having a source electrode coupled to the second voltage terminal, a drain electrode coupled to the tub, and a gate electrode coupled to the first voltage terminal, the third transistor providing reverse battery protection to the MOS circuit when the battery is temporarily connected in a reverse polarity to the first and second voltage terminals.

4. The reverse battery protection circuit of claim 3 wherein the first transistor is a MOS transistor of the first conductivity type and the second and third transistors are MOS transistors of the second conductivity type.

5. The reverse battery protection circuit of claim 3 wherein the source and drain electrodes of the third transistor are formed in the tub of the first conductivity type.

6. A reverse battery protection circuit for use in a smoke detector CMOS circuit having a first and a second voltage terminal for connection to a battery wherein the first voltage terminal is normally connected to a positive terminal of the battery and the second voltage terminal is normally connected to a negative voltage terminal, comprising:
- a transistor of a first conductivity type having a gate electrode, a source electrode coupled to the first voltage terminal, and a drain electrode coupled to an output terminal of the protection circuit;
- a first transistor of a second conductivity type having a source electrode coupled to the second voltage terminal, a drain electrode coupled to the output terminal of the protection circuit and the drain of the transistor of the first conductivity type, and a gate electrode, the source and drain electrodes being formed in a tub of the first conductivity type in a substrate of the second conductivity type; and
- a second transistor of the second conductivity type having a gate electrode coupled to the first voltage terminal, a source electrode coupled to the second voltage terminal, and a drain electrode coupled to the tub, the source and drain electrodes being formed in the tub, to provide protection to the CMOS circuit should the battery be accidentally connected to the CMOS circuit in a reverse manner.

7. The reverse battery protection circuit of claim 6 further including:
- a third transistor of the second conductivity type having a source electrode, a drain electrode and a gate electrode coupled to an input terminal of the reverse battery protection circuit; and
- a current limiting resistor connected in series with the third transistor of the second conductivity type to limit current flow in the input portions of the protection circuit.

* * * * *